(12) United States Patent
Seidler

(10) Patent No.: US 7,095,626 B2
(45) Date of Patent: Aug. 22, 2006

(54) OPENABLE ONE-PIECE ELECTRICAL RF SHIELD AND METHOD OF MANUFACTURING THE SAME

(75) Inventor: Jack Seidler, Flushing, NY (US)

(73) Assignee: Interplex Nas Inc., Flushing, NY (US)

( * ) Notice: Subject to any disclaimer, the term of this patent is extended or adjusted under 35 U.S.C. 154(b) by 111 days.

(21) Appl. No.: 10/449,807

(22) Filed: May 29, 2003

(65) Prior Publication Data

US 2004/0240192 A1    Dec. 2, 2004

(51) Int. Cl.
*H05K 9/00* (2006.01)
(52) U.S. Cl. .................. 361/816; 361/818; 361/800; 174/35 R; 174/51
(58) Field of Classification Search .......... 361/816, 361/818, 800, 752, 797, 755; 174/35 R, 174/35 MS, 51, 39; 206/149, 271, 45.24; 439/607, 61, 79–80
See application file for complete search history.

(56) References Cited

U.S. PATENT DOCUMENTS

| | | | | |
|---|---|---|---|---|
| 3,731,009 | A * | 5/1973 | Watanabe et al. | 369/139 |
| 4,816,613 | A * | 3/1989 | Ito et al. | 174/35 R |
| 5,614,694 | A * | 3/1997 | Gorenz et al. | 174/35 R |
| 5,749,178 | A * | 5/1998 | Garmong | 52/79.1 |
| 5,898,129 | A * | 4/1999 | Ott et al. | 174/59 |
| 5,984,128 | A * | 11/1999 | Pate | 220/480 |
| 6,135,790 | A * | 10/2000 | Huang et al. | 439/79 |
| 6,203,336 | B1 * | 3/2001 | Nakamura | 439/80 |
| 6,368,153 | B1 * | 4/2002 | Hwang | 439/607 |

* cited by examiner

*Primary Examiner*—Kamand Cuneo
*Assistant Examiner*—Hung S. Bui
(74) *Attorney, Agent, or Firm*—Darby & Darby

(57) ABSTRACT

An easily openable one-piece RF interference shield and method of manufacturing the same that is cost efficient and easily adapted for use with existing electrical devices. The RF shield having a plurality of interconnected sidewalls, a substantially open bottom region, and a hingeably connected top cover portion, having a top cover latch and disposed along the top edge of one of the sidewalls. The top cover portion of the shield is adapted to hinge toward another one of the sidewalls such that the top cover latch engages a hole disposed on the other sidewall being engaged and completing a protective enclosure about electrical components and preventing those components from causing electromagnetic interferences. The RF shield of the present invention allows for easy opening of the top cover portion to provide access to the enclosure for rework or repair of the electrical components covered by the shield, without having to unsolder the unit from a substrate containing the electrical components. The plurality of sidewalls include a first mating sidewall that is connected to a first intermediate sidewall, the first intermediate sidewall being connected to a second intermediate sidewall, and the second intermediate sidewall being connected to a second mating sidewall.

13 Claims, 6 Drawing Sheets

OPENABLE ONE-PIECE ELECTRICAL RF SHIELD AND METHOD OF MANUFACTURING THE SAME

FIELD OF THE INVENTION

The present invention generally relates to the field of electronics, and more specifically to a Radio Frequency (RF) interference shield for electrical devices.

BACKGROUND OF THE INVENTION

Over the past number of years, technological advancements in the area of electronic devices have experienced vast growth. An increase in the complexity and operation of the electrical components found in electrical devices combined with a decrease in the amount of space available for such components has resulted in dense clusters of electrical components. In such electrical devices, many electronic components radiate electromagnetic radiation which may cause interference with other electrical devices. This RF interference may detrimentally affect the performance and operation of other electrical devices. As a result, RF shields have been used to prevent such components from causing such interference.

The most common RF shields are comprised of a metal box contoured to fit over a PC board. These shields are then soldered onto the circuit board. Over time, the circuit board may require repair or reworking, however, it is extremely time consuming and difficult to unsolder and remove the RF shield originally in place.

Thus, there exists a continuing need for a low cost RF shield that will prevent electrical components of an electrical device from causing RF interference, yet will also allow fast and simple access to the electrical components covered by the RF shield. Such a shield should be easy to manufacture and be capable of adaptation to a wide array of electrical devices.

SUMMARY OF THE INVENTION

The present invention is directed to an openable one-piece RF interference shield and method of manufacturing the same that is cost efficient and easily adapted for use with existing electrical devices. The RF electrical interference shield can be mounted to circuit boards (e.g., by soldering) to prevent electrical components from causing RF interference. The RF shield of the present invention also allows for easy access to the interior of the shield for rework or repair of the electrical components covered by the shield, without having to unsolder the shield from the circuit board.

In accordance with one embodiment of the invention, the shield has a flat, cut out design in unassembled form. The flat, cut-out design is folded in order to create the sidewalls that define the enclosure about the electrical components to be shielded.

The fold lines define a series (e.g., 4) of connected sidewalls, with the two edge sidewalls each having an unconnected side edge. At one unconnected side edge of the sidewalls of the shield is a latch or tongue. At the other unconnected side edge is an opening or groove in which the latch fits or snaps to form the shield enclosure. A top cover, having its own folding lines, is a part of the one-piece shield. The top cover of the shield also includes a latch or tongue at its edge. The latch of the top cover has fold indentations on it so that the latch may bend and be inserted into an opening or slot located on the front sidewall of the shield, thereby completing the protective enclosure. The top cover may further include sidewall extensions that downwardly extend toward a bottom edge of the shield to complete the protective enclosure.

Once the flaps of the unassembled shield are properly folded along the fold indentations, the shield includes a plurality of sidewalls and a top cover. The RF shield does not include a bottom portion. The open bottom is necessary, otherwise the shield would cover and make inaccessible the components underneath. Instead, the open bottom combined with the plurality of sidewalls and top cover form a cavity in which the electrical components being shielded may be accessed for rework or repair. The edge sidewalls of the shield engage each other to define the protective enclosure by use of a tongue or latch on one edge sidewall designed to fit or snap into the slot or groove located on the outer edge of another sidewall. The tongue of one sidewall may be bent over and around the opening of the other sidewall to secure the enclosure. In an alternative embodiment, the groove may instead be an opening cut out of the sidewall and the tongue on one sidewall fits into the opening to secure the enclosure. The bottom edges of the sidewalls of the shield are then attached to the circuit board (e.g., by soldering), and the top cover is closed.

The openable top cover forms the top side of the RF shield and completes the protective enclosure once it is closed. Placing the top cover into the closed position involves bending the top cover at the fold indentations, and bending the top cover sidewall flaps at their corresponding fold lines, so that the cover rests over the cavity formed by the sidewalls. The tongue or latch extending from the top cover is externally situated with respect to the protective enclosure. The latch is bent such that the latch is situated over and around the front sidewall and is inserted through the hole or slot of the front sidewall, so that the end of the latch sits within the protective enclosure, thereby engaging the top cover to the sidewalls and completing the protective enclosure.

In an alternative embodiment the top cover latch may be internally situated with respect to the defined protective enclosure. That is, the top cover latch is bent such that the latch is situated inside the enclosure and extends out through the first mating sidewall hole so that the end of the top cover latch sits outside the protective enclosure. Such an alternative embodiment requires a different dimensioning of the unassembled RF shield than the previously discussed embodiment. Specifically, the top cover, up to the point where the top cover latch is disposed, must be slightly shorter in length than the previously discussed embodiment in order to allow the top cover latch to bend into the interior of the enclosure and be inserted through the first mating sidewall hole. The top cover latch is downwardly angled into the enclosure defined by the plurality of sidewalls. Positioning the top cover latch within the defined enclosure at an angle is necessary so that the latch is easier to deflect and the top cover is easier to remove. In addition, the angled latch allows an extraction tool to be easily inserted into the enclosure through an opening that is created once the latch is bent into the defined enclosure. The opening is situated between the first mating sidewall and the first bending point of the top cover latch when the top cover is in the closed position. To disengage the latch from the first mating sidewall hole, an extraction tool is slid into the opening and onto the top cover latch, thereby applying a downward force to the latch and causing it to disengage from the first mating sidewall hole. Positioning the latch perpendicularly relative to the first mating sidewall hole makes the top cover latch difficult to sufficiently deflect to remove it from the retaining hole.

The RF shield may be manufactured using a stamping process. The desired shape is cut out of a single sheet of metal or other material utilizing a stamping process. The stamped shape forms a central surface having a top edge and a bottom edge, a plurality of side flaps extending on opposite sides of the central surface, and one flap extending from the top edge of the central surface having a latch. The stamping process also cuts out the holes, latches and slots disposed on the plurality of sidewalls and also bends the sidewalls. After the side flaps are bent to form the plurality of sidewalls defining the enclosure, the bottom edge may then be attached to a substrate using conventional soldering methods or conventional clips or fasteners.

Optionally, the RF shield may be formed using plastic molding processes such as injection, or other known processes and the formed shield can then be metalized by known conventional methods. Metalizing the surfaces of the RF shield is necessary so that the shield is able to prevent the electrical components within the defined enclosure from causing electromagnetic interference outside the enclosure. In the injection molding process, heated plastic is injected into a mold that is allowed to cool, thereby hardening the plastic within the mold to the shape of the desired shield. The hardened plastic is removed from the mold and the RF shield is formed. The rotational molding process similarly begins with a mold of the RF shield. The mold is placed into a molding machine and pre-measured plastic resin is loaded into the mold. The mold is then slowly rotated on both the vertical and horizontal axes causing the plastic resin to stick to the mold and then a cooling period occurs wherein the mold continues rotating so that an even wall thickness throughout the shield is obtained. Rotational molding provides the RF shield with a consistent wall thickness and strong corners that are virtually stress free. Furthermore, a plastic formed RF shield is lighter in weight than a similarly shaped metal shield.

In the plastic molded shield, the plurality of sidewalls are molded as a three-dimensional unit having an open bottom and a top cover that is connected to the sidewalls via a living hinge. The top cover portion is molded to include a latch which allows the top cover to engage a hole or slot disposed on the plurality of sidewalls. The entire unit is then metalized. Once the RF shield has been metalized it is then attached to a substrate utilizing conventional soldering methods or conventional clips or fasteners.

These and other advantages and features of the invention will become readily apparent to those skilled in the art upon a reading of the following detailed description.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENTS

Figure 1:
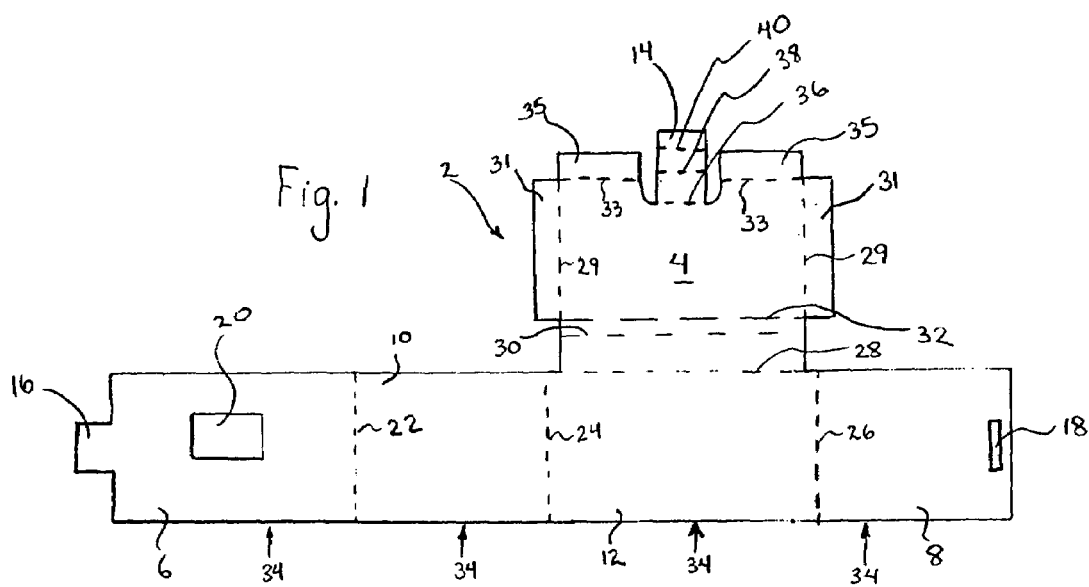
FIG. 1 illustrates an unassembled RF shield of the present invention.
Figure 2:
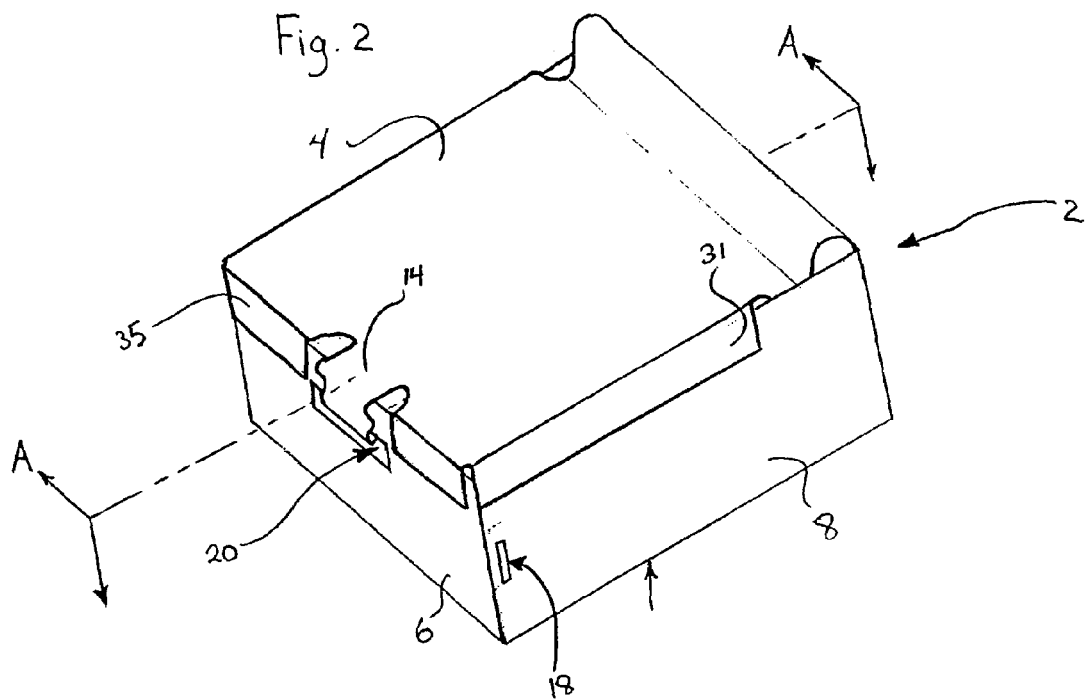
FIG. 2 is a perspective view of an RF shield constructed in accordance with the present invention.

Referring now to the drawings, the present invention is directed to an openable one-piece RF interference shield illustrated generally, in unassembled form, at 2 in FIG. 1. FIG. 2 illustrates, in perspective view, the unassembled RF shield 2 of FIG. 1 in assembled form, wherein a top cover 4 has been fitted to a first mating sidewall 6. Disengaging the top cover 4 from the first mating sidewall 6 allows for easy access to the interior of the RF shield 2 for rework or repair of the electrical components covered by the shield, without having to unsolder the base of the RF shield 2 from the circuit board.

In accordance with one embodiment of the invention, the RF shield 2 has a flat, cut out design in unassembled form illustrated in FIG. 1. The unassembled form of the RF shield 2 is folded at lines 22, 24, 26, and 28 as well as other broken line indications. To a design indicated in FIG. 2, lines 22, 24, 26, and 28 establish where the unassembled shield unit is to be folded.

Referring to FIGS. 1 and 2, the RF shield 2 includes a first mating sidewall 6, a second mating sidewall 8, a first intermediate sidewall 10, a second intermediate sidewall 12, and a top cover 4. FIGS. 1 and 2 show the top cover 4 connected to the second intermediate sidewall 12 with a top cover latch 14 engaging a first mating sidewall hole 20 to complete the protective enclosure. However, the top cover 4 can be connected to any of the other sidewalls of the shield so long as a hole or slot is disposed on a sidewall opposing the sidewall connected to the top cover 4 to provide a point of engagement for the top cover latch 14 when the shield is closed to complete the protective enclosure. The first mating sidewall 6 is at one of the unconnected side edges of the shield and is connected to the first intermediate sidewall 10 at fold line 22 and includes a first mating sidewall latch 16 and a first mating sidewall hole 20. The second mating sidewall 8 is at the other unconnected side edge and is connected to the second intermediate sidewall 12 at fold line 26 and includes a second mating sidewall hole 18. The RF shield 2 is folded along the fold lines 22, 24, and 26, creating a box-like structure with a plurality of sidewalls which define the protective enclosure. The plurality of sidewalls are secured together by engaging the first mating sidewall latch 16 with the second mating sidewall hole 18, thereby securing the first mating sidewall 6 to the second mating sidewall 8. The first mating sidewall latch 16 may also thereafter be bent over and through the second mating sidewall hole 18 to further secure the connection. Since it is unnecessary to disengage the connection between the first mating sidewall 6 and the second mating sidewall 8 for rework or repair of the electrical components being shielded, the contact point between the two mating sidewalls may be soldered to provide increased rigidity for the RF shield 2. In an alternative embodiment, the second mating sidewall hole 18 may be designed as a slot or groove that is cut out of the second mating sidewall 8 at a predetermined location. The plurality of sidewalls are then secured together by bending the first mating sidewall latch 16 through the slot or groove of the second mating sidewall 8, thereby securing the first mating sidewall 6 to the second mating sidewall 8.

The RF shield 2 further includes an open bottom with a bottom edge 34. The open bottom is necessary, otherwise the RF shield 2 would cover and make inaccessible the electrical components underneath. Instead, the open bottom combined with the plurality of sidewalls and the top cover 4 form a cavity in which the electrical components being shielded may be accessed for rework or repair. The bottom edge 34 is the contact point between the RF shield 2 and the substrate. The bottom edge 34 of the RF shield 2 is fixed to the substrate, for example by soldering the bottom edge 34 to the substrate or fastening the bottom edge to the substrate using conventional fasteners or rivets.

Figure 3:
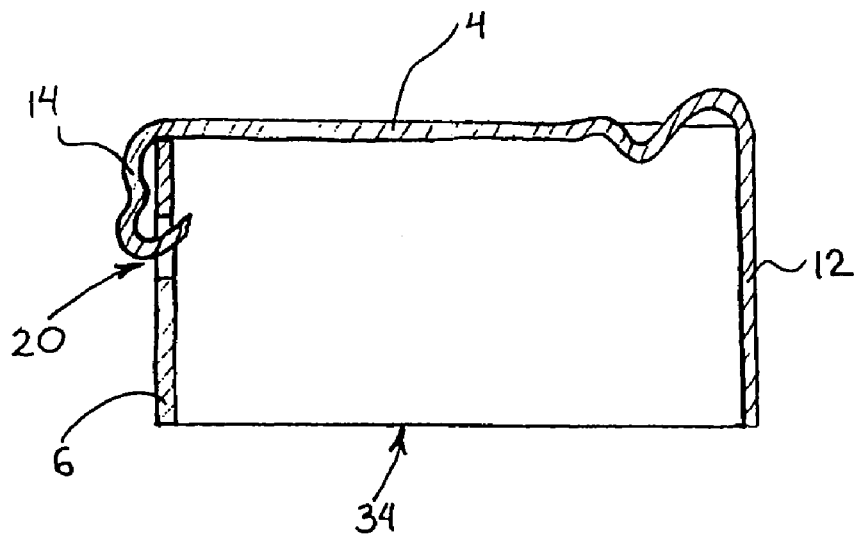
FIG. 3 is a cross-sectional view taken along lines A—A of the RF shield shown in FIG. 2.

The openable top cover 4 of the RF shield 2 completes the protective enclosure over the electrical components once the top cover 4 is placed into the closed position. FIG. 2 illustrates the openable top cover 4 situated in the closed position. The top cover 4 is connected to the second intermediate sidewall at a fold line 28, and includes fold lines 30 and 32 and a top cover latch 14. Additionally, the top cover includes fold lines 29 and 33 associated with the top cover sidewall flaps 31 and 35. As previously mentioned, the top cover 4 can alternatively be connected to any of the other sidewalls of the shield. Referring now to FIGS. 1–3, the placement of the top cover 4 into the closed position involves bending the top cover 4 at the fold line 28 toward the first mating sidewall 6, and further, bending at the fold lines 30 and 32 so that the top cover 4 rests over the cavity defined by the plurality of sidewalls. The bending at fold lines 30 and 32 assist in relieving some of the stress that may eventually break the connection at fold line 28. Alternatively, the fold lines 30 and 32 (and corresponding folding) may be omitted, for example, where repeated opening and closing of the top cover is not needed. The top cover sidewall flaps 31 and 35 are bent toward the bottom edge 34 of the RF shield 2 and allow the top cover 4 to rest on the sidewalls of the RF shield 2.

As illustrated in FIG. 3, the top cover latch 14 is externally situated with respect to the defined protective enclosure. The top cover latch 14 includes fold lines 36, 38, and 40, shown in FIG. 1. The top cover latch 14 is bent at fold lines 38 and 40 so that the latch bends over and around the top of the first mating sidewall 6 and is inserted through the first mating sidewall hole 20. The end of the top cover latch 14 sits within the defined protective enclosure, and thereby engages the top cover 4 and the plurality of sidewalls and completes the protective enclosure by locking the RF shield 2 into the closed position.

Figure 5:
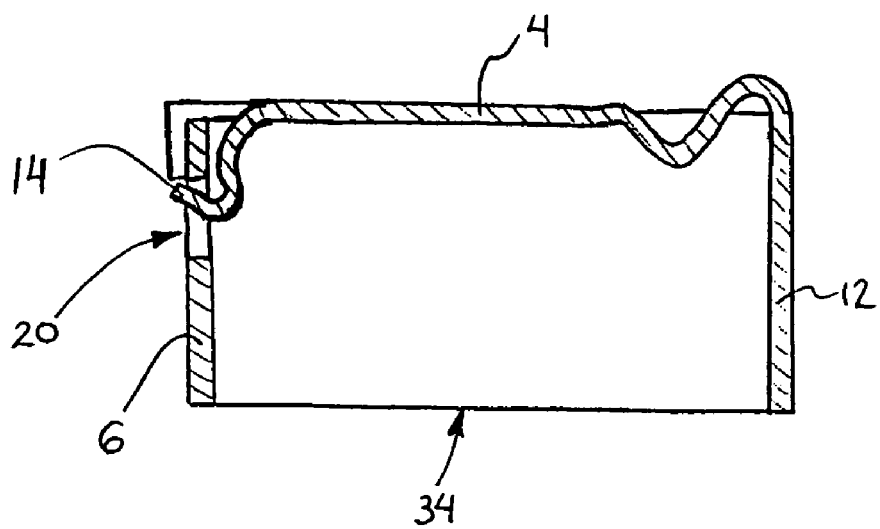
FIG. 5 is a cross-sectional view of the alternative design of FIG. 4 taken along lines B—B of the RF shield shown in FIG. 4.
Figure 4:
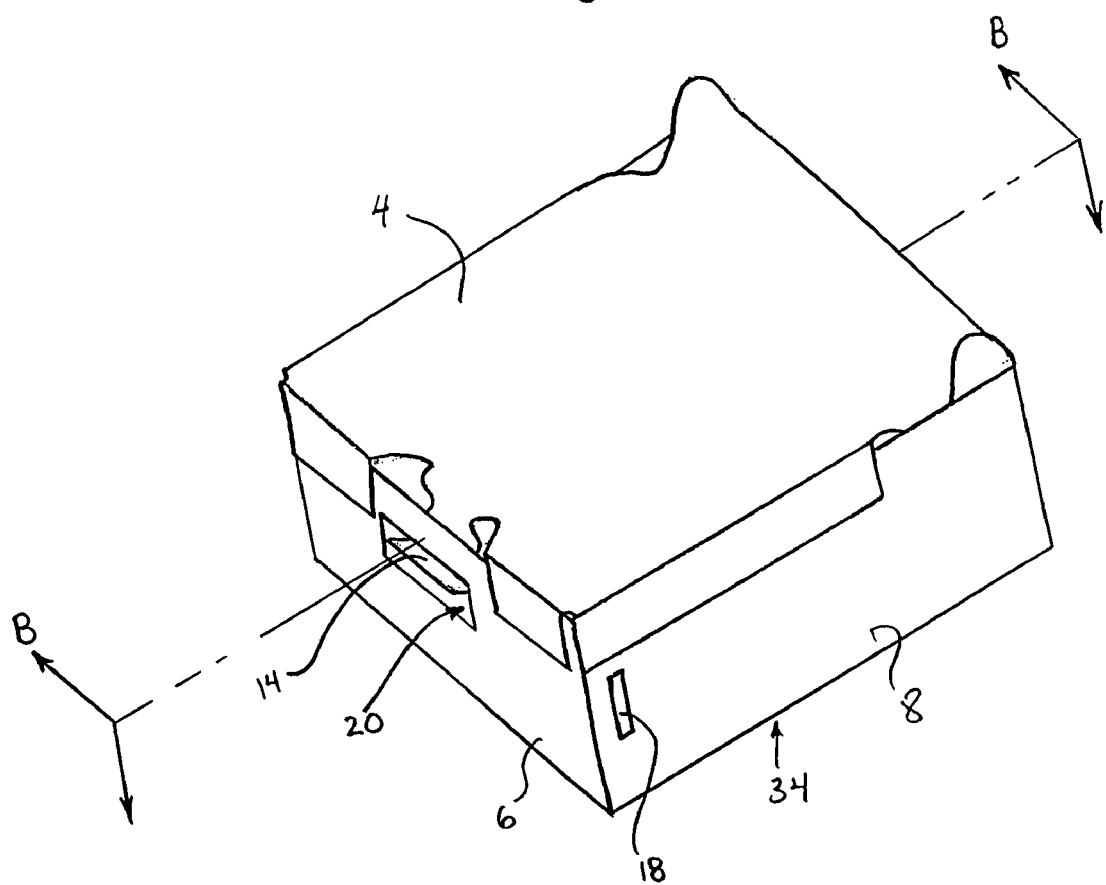
FIG. 4 illustrates an alternative design of an assembled RF shield.

In an alternative embodiment, illustrated in FIGS. 4 and 5, the top cover latch 14 may be internally situated with respect to the defined protective enclosure. That is, the top cover latch 14 is bent at fold lines 36 and 40 so that a portion of the latch is inside the enclosure and then the latch is inserted through the first mating sidewall hole 20. The remainder of the latch extends out through the first mating sidewall hole 20 so that the end of the top cover latch 14 sits outside the protective enclosure. The positioning of the top cover latch 14 through the first mating sidewall hole 20 locks the top cover 4 to the first mating sidewall and completes the protective enclosure.

An internally situated top cover latch 14 requires a different dimensioning of the unassembled RF shield 2 than the previously discussed embodiment. Specifically, the top cover 4, up to the point where the top cover latch 14 is disposed, must be slightly shorter in length than the previously discussed embodiment in order to allow the top cover latch 14 to bend into the interior of the enclosure. The top cover latch 14 is downwardly angled into the enclosure defined by the plurality of sidewalls as a result of bending along fold line 36. Positioning the top cover latch 14 within the defined enclosure at an angle is necessary so that the latch is easier to deflect and the top cover 4 is easier to remove. In addition, the angled latch allows an extraction tool to be easily inserted into the enclosure through an opening that is created once the latch is bent into the defined enclosure. The opening is situated between the first mating sidewall 6 and the first bending point of the top cover latch 14 (or fold line 36) when the top cover 4 is in the closed position. To disengage the latch from the first mating sidewall hole 20, an extraction tool is slid into the opening and onto the top cover latch 14, thereby applying a downward force to fold line 40 and the latch and causing it to disengage from the first mating sidewall hole 20. Positioning the latch perpendicularly relative to the first mating sidewall hole 20 makes the top cover latch 14 difficult to sufficiently deflect to remove it from the retaining hole.

Figure 6:
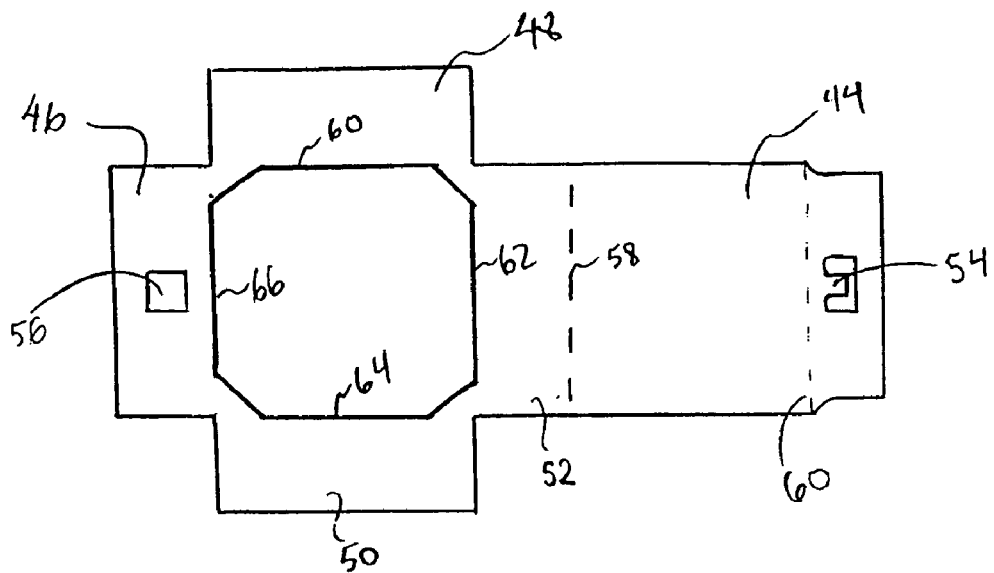
FIG. 6 illustrates an alternative design of the unassembled RF shield.
Figure 7:
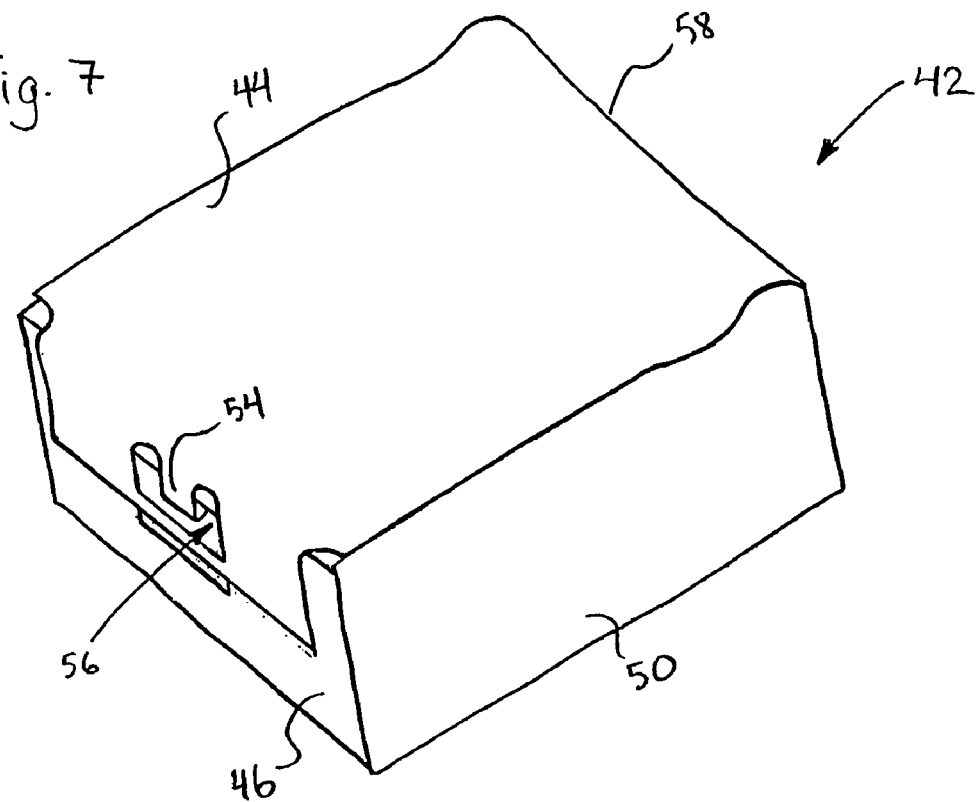
FIG. 7 is a perspective view of the alternative design of the RF shield shown in FIG. 6.

FIGS. 6 and 7 illustrate an alternative embodiment of the present invention wherein the RF shield 42 includes a mating top cover 44 disposed with a latch 54 and fold lines 58 and 60 and a plurality of sidewalls which define the protective enclosure. A polygonal hole is defined by lines 60, 62, 64 and 66. The plurality of sidewalls are formed by bending the sidewalls along fold lines 60, 62, 64 and 66, external of the polygonal hole, upward. The plurality of sidewalls include a mating or front sidewall 46 disposed with a hole 56, left and right sidewalls 48, and 50, and a rear sidewall 52 which is formed when the mating top cover 44 is folded along fold line 58. The mating top cover 44 engages the mating sidewall 46, and thereby completes the protective enclosure, by bending the mating top cover 44 at its fold line 60 toward the open bottom region and further bending the latch 54 and inserting the latch 54 through the hole 56 of the mating sidewall 46 so that the end of the latch 54 is positioned within the protective enclosure. An open bottom region is necessary, otherwise the RF shield 2 would cover and make inaccessible the electrical components underneath. A bottom edge, that is defined by fold lines 60, 62, 64 and 66, defines the contact edges between the RF shield 42 and the substrate. The bottom edge is fixed to the substrate, for example by soldering the bottom edge to the substrate or fastening the bottom edge to the substrate using conventional fasteners or rivets.

Figure 8:
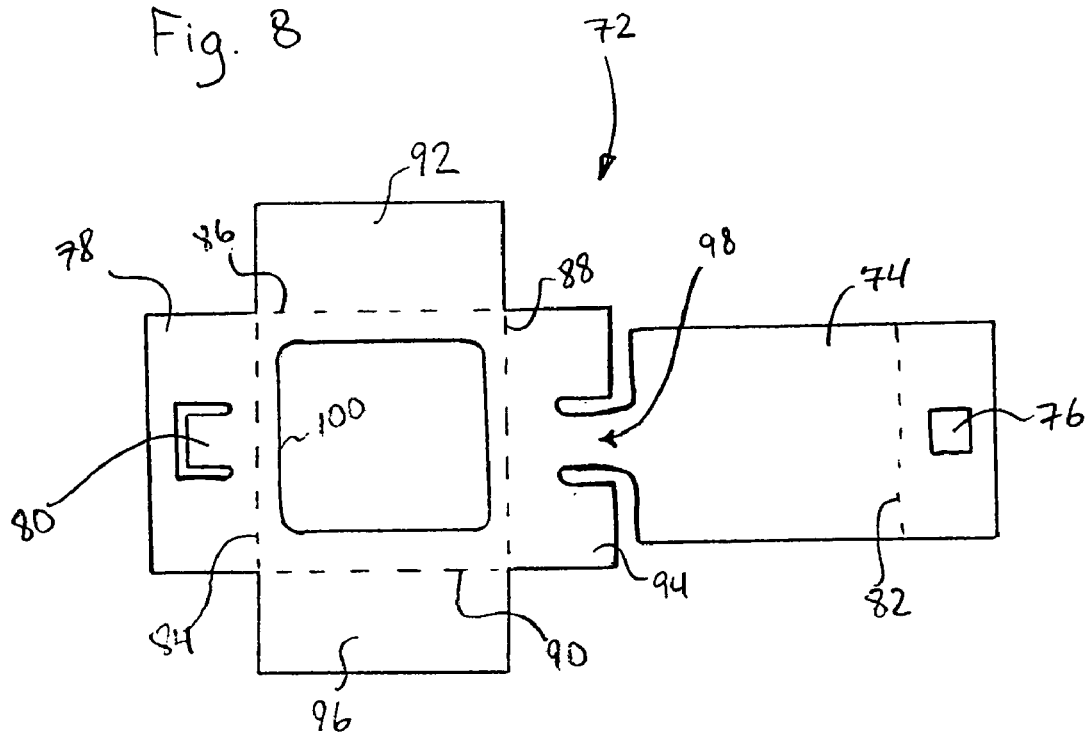
FIG. 8 illustrates an alternative design of the unassembled RF shield.
Figure 9:
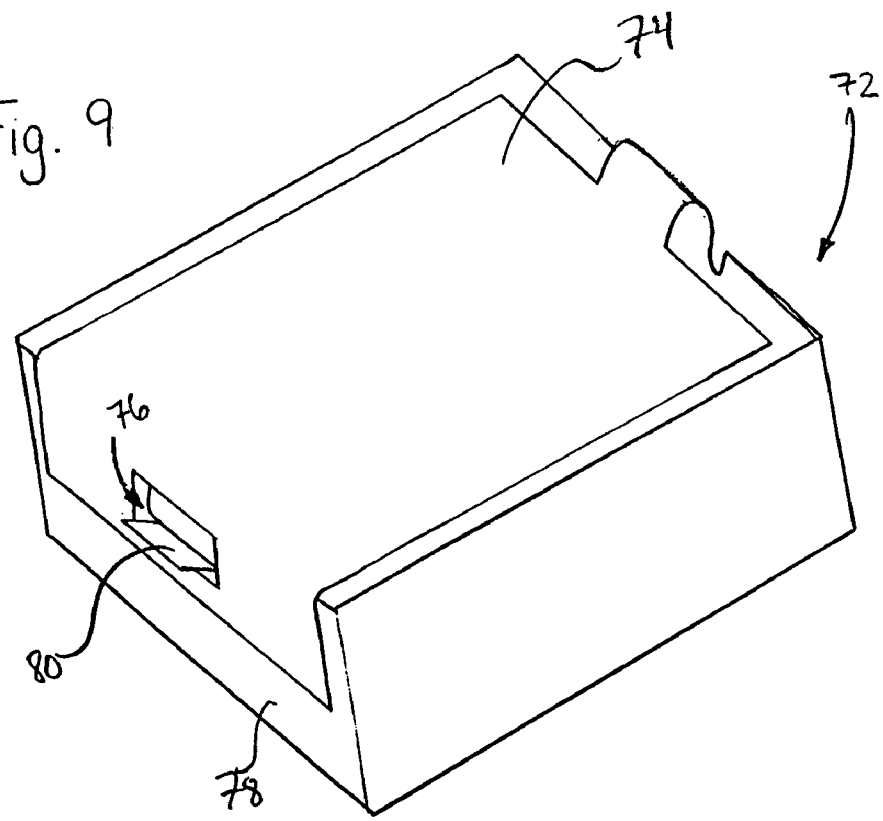
FIG. 9 is a perspective view of the alternative design of the RF shield shown in FIG. 8.

FIGS. 8 and 9 illustrate another alternative embodiment of the present invention wherein the RF shield 72 includes a mating top cover 74, disposed with a hole 76 and fold line 82, which engages a mating sidewall 78 disposed with a latch 80. A plurality of sidewalls are formed by bending the mating sidewall 78, a left sidewall 92, a right sidewall 96, and a rear sidewall 94 upwards along fold lines 84, 86, 90, and 88 respectively. The plurality of sidewalls define a protective enclosure wherein the electrical components sought to be shielded are situated. The bottom edge 100 is affixed to a substrate using conventional soldering methods or conventional clips or fasteners. The mating top cover 74 is preferably connected to the rear sidewall 94 at tab 98. The tab 98 is bent towards the defined protective enclosure to position the mating top cover 74 over the defined enclosure.

Further, the mating top cover 74 is bent along fold line 82 so that the hole 76 is positioned proximate the latch 80. The latch 80 is bent and inserted through the hole 76 to secure the mating top cover 74 to the mating sidewall 78 and thereby completing the protective enclosure. Similarly, the mating top cover 74 is opened to reveal the defined enclosure by disengaging the latch 80 from the hole 76 and bending the mating top cover 74 at tab 98 upwards and away from the defined enclosure. Alternatively, the mating top cover 74 is disposed with the latch 80 and the mating sidewall is disposed with the hole 76.

Referring again to FIGS. 1 and 2, the RF shield 2 may be manufactured using a stamping process. The shape illustrated in FIG. 1 is cut out of a single sheet of metal or other material utilizing a stamping process. The stamped shape forms a central surface having a top edge and a bottom edge, a plurality of flaps extending on opposite sides of the central surface, and one flap extending from the top edge of the central surface having a latch. The stamping process creates the components of the RF shield 2 and forms the shield in one operation.

Figure 10:
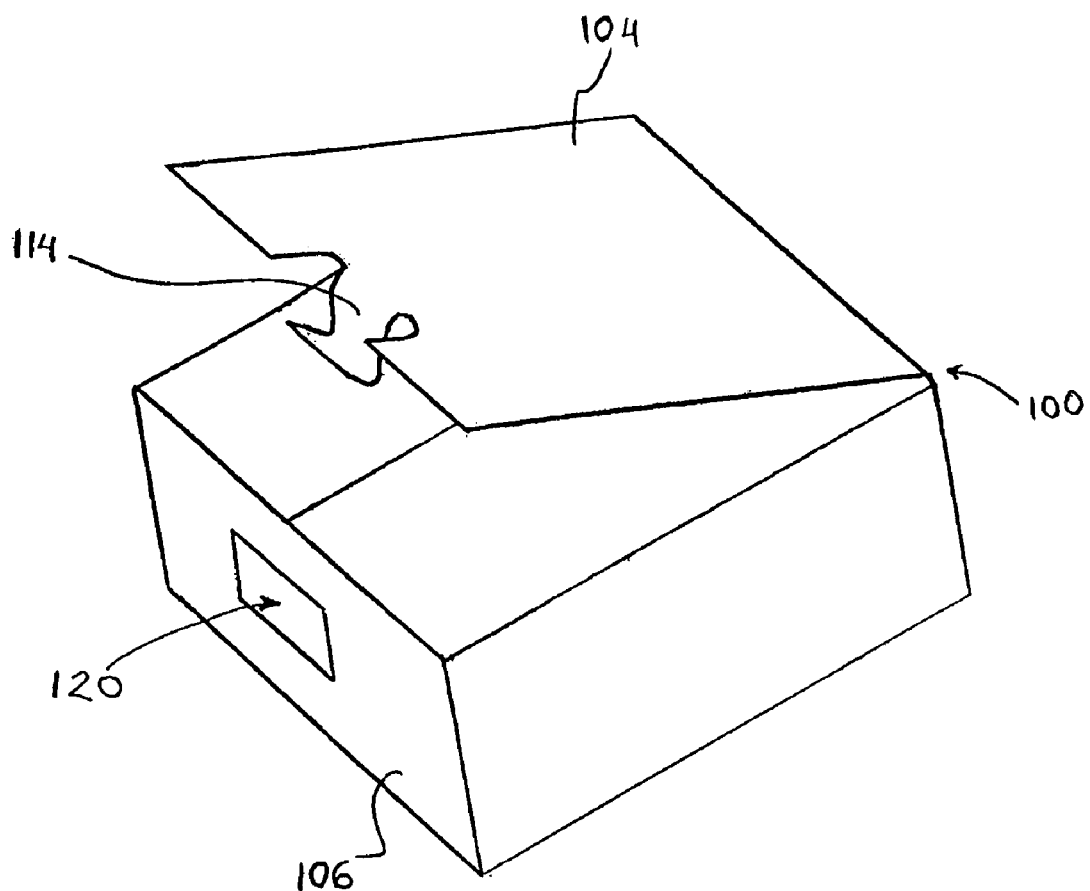
FIG. 10 is a perspective view of a molded RF shield constructed in accordance with the present invention.

Referring now to FIG. 10, optionally, the RF shield 102 may be formed using plastic molding processes such as injection or other known processes. The formed shield can then be metalized by conventional methods. Metalizing the surfaces of the RF shield 102 is necessary so that the shield is able to prevent the electrical components within the defined enclosure from causing electromagnetic interference outside the enclosure. In the injection molding process, heated plastic is injected into a mold that is allowed to cool, thereby hardening the plastic within the mold to the shape of the desired shield.

FIG. 10 illustrates a perspective view of a plastic molded RF shield 102 constructed in accordance with the present invention. In the plastic molded RF shield 102, the plurality of sidewalls are molded as a three-dimensional unit having an open bottom and a top cover 104 that is connected to the sidewalls via a living hinge 100. The top cover portion 104 is molded to include a top cover latch 114 which allows the top cover to engage a hole 120 disposed on the first mating sidewall 106. The entire unit is then metalized. Once the RF shield 102 has been metalized it is then attached to a substrate utilizing conventional soldering methods or conventional clips or fasteners.

While the invention has been particularly shown and described with reference to preferred embodiments thereof, it will be understood by those skilled in the art that various changes in form and details may be made therein without departing from the spirit and scope of the invention.

What is claimed is:

1. A one-piece electromagnetic shield comprising:
   a plurality of sidewalls each having a bottom edge and a top edge, and a hingeably connected top cover portion disposed along the top edge of one of the plurality of sidewalls, the plurality of sidewalls and top cover portion defining an enclosure having a substantially open bottom region;
   a first one of the sidewalls including a sidewall latch, a second one of the sidewalls including a slot, the first sidewall being disposed opposite the second sidewall such that the sidewall latch is inserted into the slot; and
   the top cover portion including a top cover latch and adapted to hinge toward one of the sidewalls and engage a hole disposed on the sidewall located opposite the top cover portion to thereby form the enclosure.

2. A one-piece electromagnetic shield according to claim 1, wherein the plurality of sidewalls include a first mating sidewall, which is connected to a second mating sidewall, which in turn is connected to a first intermediate sidewall, which in turn is connected to a second intermediate sidewall.

3. A one-piece electromagnetic shield according to claim 2, wherein the first mating sidewall includes a first mating sidewall latch.

4. A one-piece electromagnetic shield according to claim 3, wherein the second mating sidewall includes a second mating sidewall slot adapted to engage the first mating sidewall latch.

5. A one-piece electromagnetic shield according to claim 2, wherein the top cover portion is hingeably connected to the second intermediate sidewall.

6. A one-piece electromagnetic shield according to claim 2, wherein the first mating sidewall includes a first mating sidewall hole adapted to engage the top cover latch.

7. A one-piece electromagnetic shield according to claim 6, wherein the top cover latch includes fold lines to allow the top cover latch to bend and be inserted through the first mating sidewall hole and thereby engage the top cover portion and the first mating sidewall.

8. A one-piece electromagnetic shield according to claim 1, wherein the plurality of sidewalls and the top cover portion comprise metal.

9. A one-piece electromagnetic shield according to claim 1, wherein the plurality of sidewalls and the top cover portion are formed using a plastic molding process and at least a selected portion of the shield is metalized.

10. A one-piece electromagnetic shield comprising:
    a plurality of interconnected sidewalls each having a top edge and a bottom edge and including a first mating sidewall that is connected to a first intermediate sidewall, the first intermediate sidewall being connected to a second intermediate sidewall, the second intermediate sidewall being connected to a second mating sidewall, the first and second mating sidewalls each having an unconnected side edge, the first mating sidewall having a first mating sidewall latch disposed on its unconnected edge and the second mating sidewall having a second mating sidewall slot disposed on its unconnected edge and adapted to engage the first mating sidewall latch;
    a hingeably connected top cover portion disposed along the top edge of one of the intermediate sidewalls and including a top cover latch;
    the top cover portion adapted to hinge toward one of the mating sidewalls such that the top cover latch engages a hole disposed on the mating sidewall being engaged, the top cover latch including fold lines to allow the top cover latch to bend and be inserted through the mating sidewall hole.

11. A one-piece electromagnetic shield comprising:
    a plurality of interconnected sidewalls;
    each of the sidewalls having a bottom edge and top edge;
    the plurality of interconnected sidewalls forming an enclosed region having an open bottom portion at the bottom edge of each respective sidewall;
    a first one of the sidewalls including a slot;
    a second one of the sidewalls different from the first sidewall being hingeably connected to a top cover portion along the top edge of the second sidewall;
    the top cover portion including a top cover portion latch; and
    the top cover portion latch adapted to engage the first sidewall to allow the top cover portion to cover the enclosed region along the top edge of the plurality of interconnected sidewalls.

12. The one-piece electromagnetic shield of claim 11, wherein the plurality of interconnected sidewalls and top cover portion are composed of metallized molded plastic.

13. A one-piece electromagnetic shield comprising:

a plurality of sidewalls each having a bottom edge and a top edge, and a hingeably connected top cover portion disposed along the top edge of one of the plurality of sidewalls, said sidewalls and top cover portion being formed of a single sheet of material having at least a metallic surface, the plurality of sidewalls and top cover portion defining an enclosure having a substantially open bottom region;

a first one of the sidewalls including a sidewall latch, a second one of the sidewalls including a slot, the first sidewall being disposed opposite the second sidewall such that the sidewall latch is inserted into the slot; and the top cover portion including a top cover latch and adapted to hinge toward one of the sidewalls and engage a hole disposed on the sidewall located opposite the top cover portion to thereby form the enclosure.

* * * * *